United States Patent
Kim et al.

(10) Patent No.: US 7,932,551 B2
(45) Date of Patent: Apr. 26, 2011

(54) NONVOLATILE MEMORY DEVICE AND METHOD OF FABRICATING THE SAME COMPRISING A DUAL FIN STRUCTURE

(75) Inventors: Won-joo Kim, Hwaseong-si (KR); Yoon-dong Park, Yongin-si (KR); June-mo Koo, Seoul (KR); Suk-pil Kim, Yongin-si (KR); Sung-jae Byun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 481 days.

(21) Appl. No.: 11/902,511

(22) Filed: Sep. 21, 2007

(65) Prior Publication Data

US 2008/0157176 A1 Jul. 3, 2008

(30) Foreign Application Priority Data

Dec. 28, 2006 (KR) .................. 10-2006-0136836
Sep. 18, 2007 (KR) .................. 10-2007-0094901

(51) Int. Cl.
*H01L 27/108* (2006.01)
*H01L 29/94* (2006.01)
(52) U.S. Cl. ............. 257/314; 257/324; 257/E29.275
(58) Field of Classification Search ........ 257/E29.275, 257/314, 324
See application file for complete search history.

(56) References Cited

U.S. PATENT DOCUMENTS

| | | | |
|---|---|---|---|
| 6,664,582 B2 | 12/2003 | Fried et al. | |
| 6,787,406 B1 | 9/2004 | Hill et al. | |
| 6,876,042 B1 | 4/2005 | Yu et al. | |
| 2005/0035415 A1* | 2/2005 | Yeo et al. | 257/401 |
| 2005/0077553 A1* | 4/2005 | Kim et al. | 257/288 |
| 2005/0226047 A1* | 10/2005 | Hieda et al. | 365/185.14 |
| 2005/0242391 A1 | 11/2005 | She et al. | |
| 2005/0266638 A1* | 12/2005 | Cho et al. | 438/257 |
| 2006/0115978 A1 | 6/2006 | Specht et al. | |
| 2007/0018201 A1* | 1/2007 | Specht et al. | 257/204 |
| 2007/0018237 A1* | 1/2007 | Kim et al. | 257/324 |
| 2007/0090443 A1* | 4/2007 | Choi et al. | 257/314 |
| 2007/0183204 A1* | 8/2007 | Kim et al. | 365/185.17 |

OTHER PUBLICATIONS

European Search Report dated Dec. 10, 2009.

* cited by examiner

*Primary Examiner* — Kenneth A Parker
*Assistant Examiner* — David Z Chen
(74) *Attorney, Agent, or Firm* — Harness, Dickey & Pierce, P.L.C.

(57) ABSTRACT

A nonvolatile memory device is provided. In the nonvolatile memory device, a semiconductor substrate of a first conductivity type includes first and second fins. A common bit line electrode connects one end of the first fin to one end of the second fin. Control gate electrodes cover the first and second fins and expand across the top surface of each of the first and second fins. A first string selection gate electrode positioned between the common bit line electrode and the control gate electrodes may cover the first and second fins and expand across the top surface of each of the first and second fins. A second string selection gate electrode positioned between the first string selection gate electrode and the control gate electrodes may cover the first and second fins and expand across the top surface of each of the first and second fins.

20 Claims, 12 Drawing Sheets
(3 of 12 Drawing Sheet(s) Filed in Color)

NONVOLATILE MEMORY DEVICE AND METHOD OF FABRICATING THE SAME COMPRISING A DUAL FIN STRUCTURE

PRIORITY STATEMENT

This application claims priority under 35 U.S.C. §119 to Korean Patent Application Nos. 2006-0136836 and 2007-0094901, filed on Dec. 28, 2006 and Sep. 18, 2007, respectively, in the Korean Intellectual Property Office (KIPO), the entire contents of which are herein incorporated.

BACKGROUND

1. Field

Example embodiments relate to a semiconductor device that stores data via a charge storage layer, and a method of fabricating the same.

2. Description of Related Art

Today, semiconductor devices are required to be both smaller in size and capable of processing large amounts of data at higher operating speeds. Accordingly, much research has been conducted to increase the operating speed and integration density of nonvolatile memory devices used in semiconductor devices. For example, the area of the channel of a Fin-FET semiconductor device can be broadened to enhance the operating speed, and simultaneously the width of the fin of the device can be narrowed to improve the integration density.

However, it may be difficult to form a bit line contact with low resistance in the cases of a fin-FET and a fin memory cell, and a fin-FET including a fin formed on an insulating layer. For example, the fin-FET may include bit line contacts formed across fins and the bit line contacts may be in contact with a narrow top surface of the fins. As such, the resistance of the bit line contacts may be higher. In addition, because the fins are structurally bent to form the bit line contacts, the process of manufacturing the fin-FET may be more difficult.

Further, source and drain regions may be connected to fins and broadly formed to secure a contact area. However, the distance between the fins may become larger due to the source and drain regions, and as a result, the integration density of the fin-FET may be lower.

SUMMARY

Example embodiments provide a nonvolatile memory device having higher integration and lower bit line contact resistance. Example embodiments also provide a method of more economically fabricating the nonvolatile memory device.

According to example embodiments, a nonvolatile memory device may include a semiconductor substrate of a first conductivity type having first and second fins. A common bit line electrode may connect one end of the first fin to one end of the second fin. A plurality of control gate electrodes may cover the first and second fins and expand across the top surface of each of the first and second fins. A first string selection gate electrode may be positioned between the common bit line electrode and the plurality of control gate electrodes. The first string selection gate electrode may cover the first and second fins and expand across the top surface of each of the first and second fins. A second string selection gate electrode may be positioned between the first string selection gate electrode and the plurality of control gate electrodes. The second string selection gate electrode may cover the first and second fins and expand across the top surface of each of the first and second fins. A portion of the first fin under the first string selection gate electrode and a portion of the second fin under the second string selection gate electrode may have a second conductivity type opposite to the first conductivity type.

The nonvolatile memory device may further comprise a buried insulating layer filled between the first and second fins, and the first and second fins may be adjacent to the buried insulating layer.

The nonvolatile memory device may further comprise a source or drain region of the second conductivity type that may be defined by the portions of the first and second fins between the common bit line electrode, the first string selection gate electrode, the second string selection gate electrode, and the plurality of control gate electrodes.

According to example embodiments, a method of fabricating a nonvolatile memory device may include providing a semiconductor substrate of a first conductivity type having first and second fins in which first and second regions are defined in different rows from each other. A first path region of a second conductivity type opposite to the first conductivity type may be formed in the first region of the first fin. A second path region of the second conductivity type may be formed in the second region of the second fin. A first string selection gate electrode may be formed to cover the first and second fins in the first region and to expand across the top surface of each of the first and second fins. A second string selection gate electrode may be formed to cover the first and second fins in the second region and to expand across the top surface of each of the first and second fins.

The forming of the first path region and/or the forming of the second path region may be performed using the tilt ion implantation method.

BRIEF DESCRIPTION OF THE DRAWINGS

The patent or application file contains at least one drawing executed in color. Copies of this patent or patent application publication with color drawing will be provided by the Office upon request and payment of the necessary fee.

Example embodiments will be more clearly understood from the following detailed description taken in conjunction with the accompanying drawings.

FIG. 1 is a circuit diagram of a nonvolatile memory device according to example embodiments;

FIG. 2 is a schematic plan view of a nonvolatile memory device according to example embodiments;

FIG. 3 is a cross-sectional view taken along Line III-III' of the nonvolatile memory device of FIG. 2;

FIG. 4 is a cross-sectional view taken along Line IV-IV' of the nonvolatile memory device of FIG. 2;

FIG. 5 is a cross-sectional view taken along Line V-V' of the nonvolatile memory device of FIG. 2;

FIGS. 6, 8, and 10 are plan views for describing a method of fabricating a nonvolatile memory device according to example embodiments;

FIGS. 7 and 9 are cross-sectional views taken along Line VII-VII' and Line IX-IX' of the nonvolatile memory device of FIGS. 6 and 8, respectively.

FIGS. 11 through 13 are simulation perspective views of doping profiles of a nonvolatile memory device according to example embodiments;

FIG. 14 is a simulation graph of the voltage-current characteristics of a nonvolatile memory device according to example embodiments; and FIGS. 15 and 16 are simulation perspective views of electron concentration profiles of a nonvolatile memory device according to an experimental example.

DETAILED DESCRIPTION OF EXAMPLE EMBODIMENTS

Figure 1:
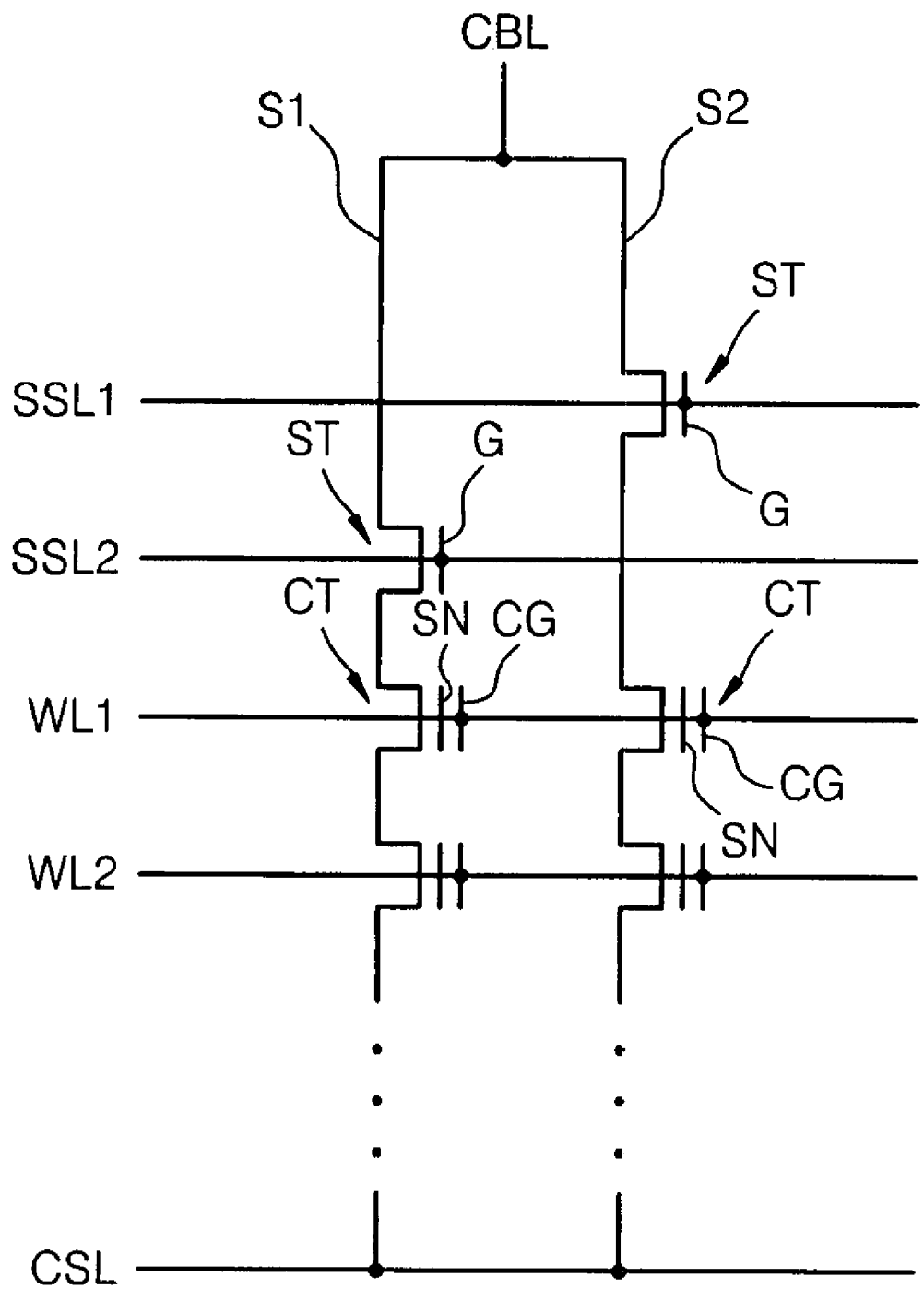
FIGS. 1-16 represent non-limiting, example embodiments as described herein.

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram of a nonvolatile memory device according to example embodiments. The nonvolatile memory device may have a NAND structure.

The nonvolatile memory device may include a pair of first and second strings S1 and S2. The first string S1 and the second string S2 may be connected to each other by a common bit line CBL. The first string S1 and the second string S2 may have memory transistors CT having a NAND cell array structure and string selection transistors ST separating a signal of the common bit line CBL. The common bit line CBL may be positioned outside the string selection transistors ST of the first string S1 and the second string S2.

In comparison to a conventional separate bit line structure which may be connected to each of the strings S1 and S2, the common bit line CBL of example embodiments may have a broader area. Thus, the common bit line CBL may have a sufficiently lower resistance and therefore, the strings S1 and S2 may be positioned closer to each other. As a result, the integration density of the nonvolatile memory device may be improved.

The first string S1 may include one string selection transistor ST and a plurality of memory transistors CT connected in a series. However, the scope of example embodiments is not limited to the number of memory transistors CT illustrated in FIG. 1. The string selection transistor ST may include a gate G. The gate G may control turn-on or turn-off operations of the string selection transistor ST. For example, the string selection transistor ST may include a MOSFET (MOS field effect transistor).

The second string S2 may have a similar structure to that of the first string S1. That is, the second string S2 may include one string selection transistor ST and a plurality of memory transistors CT connected in a series. However, the second string S2 may be different from the first string S1 in the way each string selection transistor ST is positioned. The string selection transistors ST of the first string S1 and the string selection transistors ST of the second string S2 may be positioned in different rows. For example, the string selection transistor ST of the first string S1 may be positioned at a second row and the string selection transistor ST of the second string S2 may be positioned at a first row. However, example embodiments are not limited to this order arrangement.

Each of the memory transistors CT may include a control gate CG and a storage node SN. The control gate CG may control the state of the storage node SN. The storage node SN may be for charge storage. For example, the memory transistors CT may form a cell region of the nonvolatile memory device.

A first string selection line SSL1 may be connected to the gate G of the string selection transistor ST of the second string S2 and may be positioned across the first and second strings S1 and S2. A second string selection line SSL2 may be connected to the gate G of the string selection transistor ST of the first string S1 and may be positioned across the first and second strings S1 and S2. Thus, when the first string S1 and the second string S2 are positioned in columns, the first string selection line SSL1 and the second string selection line SSL2 may be positioned in rows. The first string selection line SSL1 and the second string selection line SSL2 may be positioned in different rows from each other.

A plurality of word lines WL1 through WLn may be respectively connected to the control gate CG of each memory transistor CT positioned in the same row of the first and second strings S1 and S2, and may be positioned across the first and second strings S1 and S2. The number of the word lines WL may be determined according to the position of the memory transistors CT as illustrated in FIG. 1.

Whereas one end of the first string S1 may be connected to one end of the second string S2 by the common bit line CBL as described above, the other end of the first string S1 may be connected to the other end of the second string S2 by a common source line CSL. That is, the common source line CSL may be positioned to be opposite to the common bit line CBL. In example embodiments, one source selection line (not shown) may be further positioned in the first string S1 and the second string S2 above the common source line CSL, and the source selection line may be connected to each source selection transistor (not shown). In addition, two source selection lines (not shown) may be further positioned in the first string S1 and the second string 52 above the common source line CSL. In this case, the structure of the source selection lines may be positioned to be symmetrical to the string selection lines SSL1 and SSL2.

In the above-described nonvolatile memory device, the common bit line CBL structure may be used to improve the integration density, and the string selection lines SSL1 and SSL2 of the strings S1 and S2 may be separated from each other to individually operate the strings S1 and S2.

In example embodiments, the number of the strings S1 and S2 are only exemplary. Therefore, the nonvolatile memory device may further comprise a plurality of pairs of strings. In this case, different pairs of strings may be respectively connected to different common bit lines (not shown).

Figure 2:
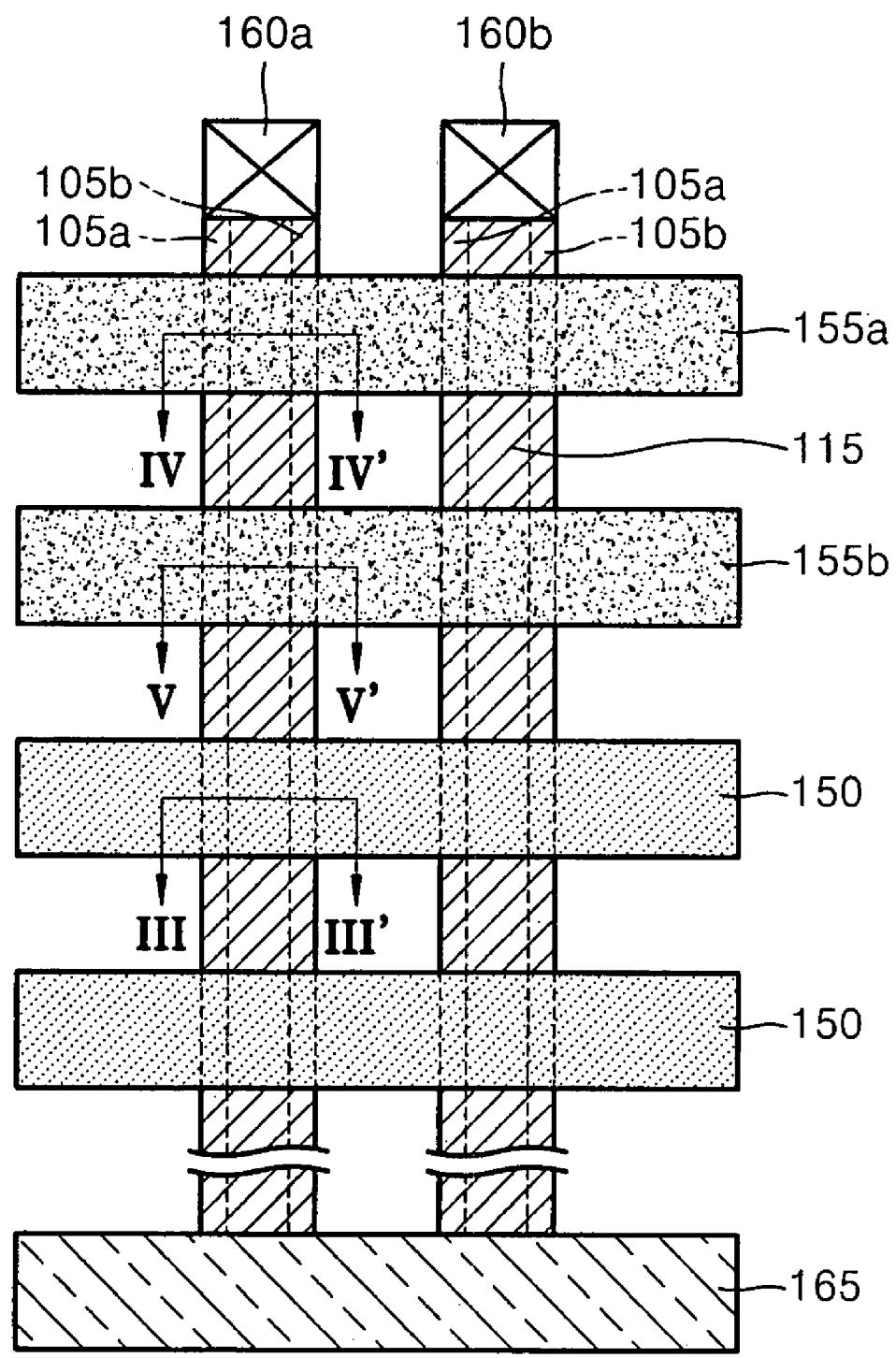
Figure 3:
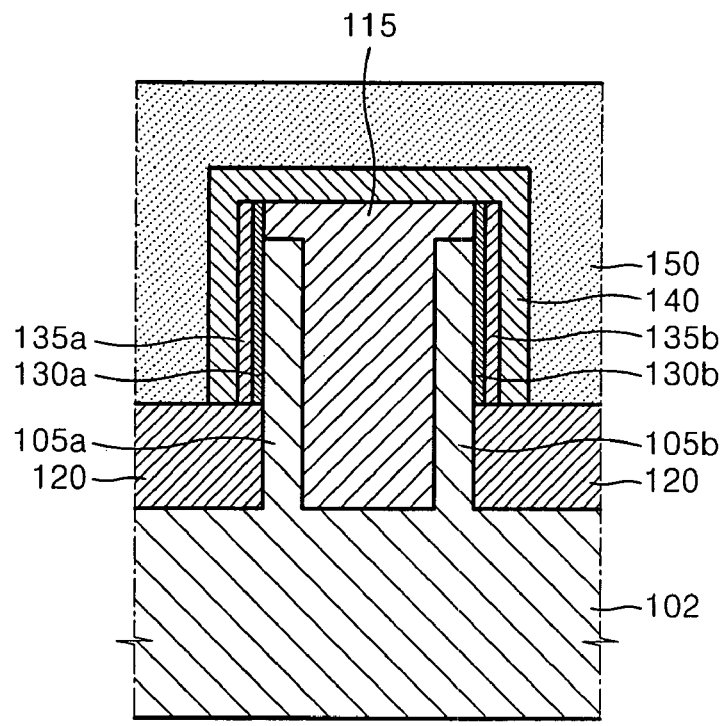
Figure 4:
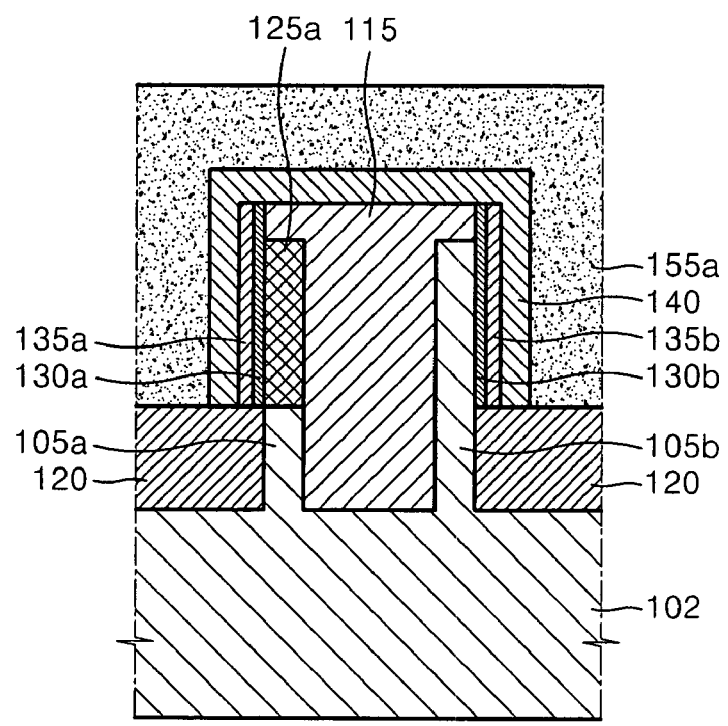
Figure 5:
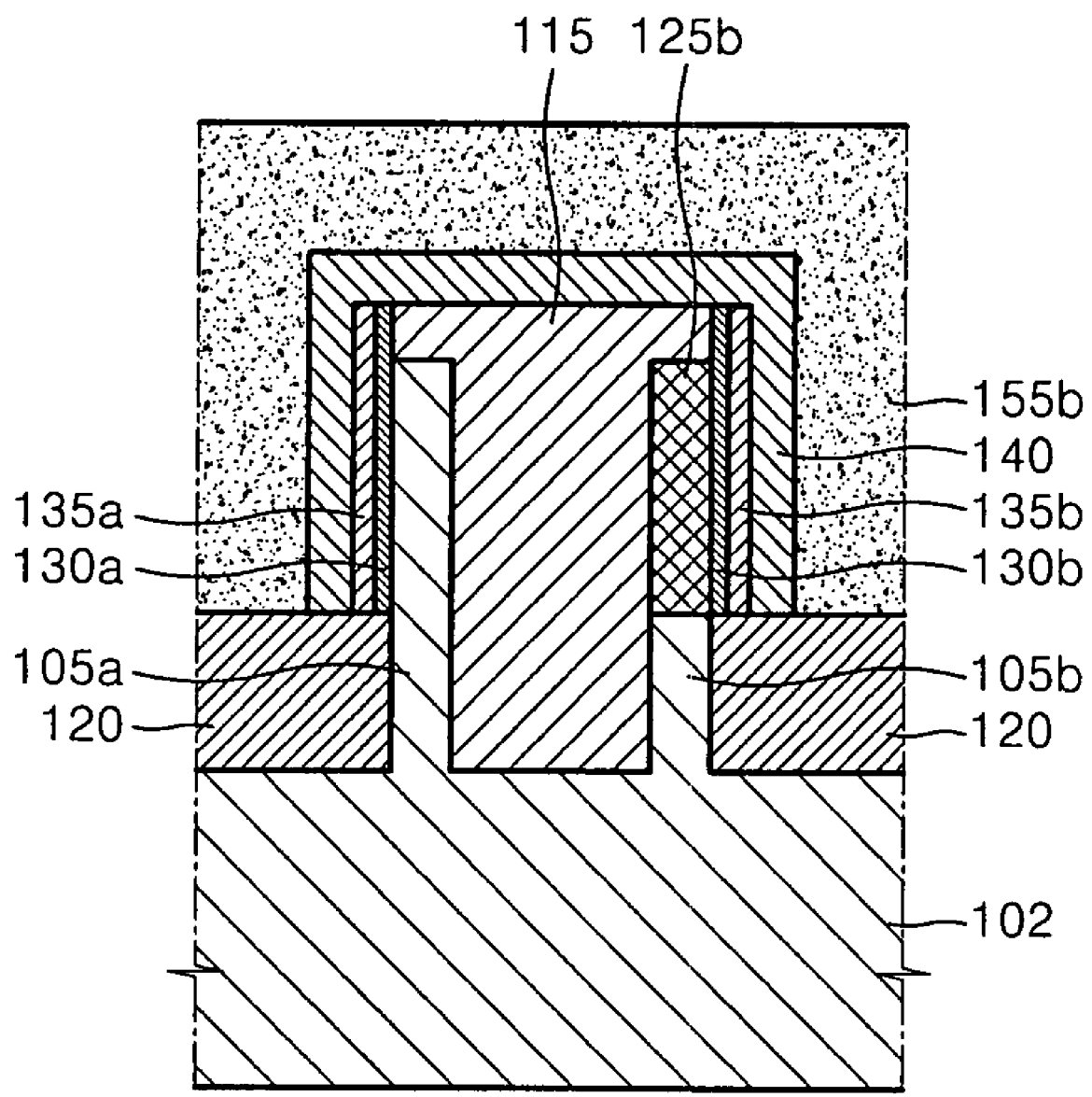

FIG. 2 is a schematic plan view of a nonvolatile memory device according to example embodiments. FIGS. 3, 4, and 5 are cross-sectional views taken along Line III-III', Line IV-IV' and Line V-V', respectively, of the nonvolatile memory device of FIG. 2. In FIG. 2, only the main structure of the nonvolatile memory device is illustrated.

In FIG. 2, a semiconductor substrate may include a plurality of pairs of first and second fins 105a and 105b. One end of the first fin 105a and one end of the second fin 105b in each pair may be connected to each of common bit line electrodes 160a and 160b. The other end of each of the first and second fins 105a and 105b may be connected to a common source line electrode 165. First and second string selection gate electrodes 155a and 155b and a plurality of control gate electrodes 150 may be positioned in columns across the top of each of the first and second fins 105a and 105b.

The first and second string selection gate electrodes 155a and 155b may be positioned between the common bit line electrodes 160a and 106b and the control gate electrodes 150. For example, the first string selection gate electrode 155a may be positioned to be adjacent to the common bit line electrodes 160a and 160b, and the second string selection gate electrode 155b may be positioned between the first string selection gate electrode 155a and the control gate electrodes 150.

The semiconductor substrate may be of a first conductivity type. A source or a drain region (not shown) of a second conductivity type may be defined in portions of the first and second fins 105a and 105b between the common bit line electrodes 160a and 160b, the first and second string selection gate electrodes 155a and 155b, the control gate electrodes, and the common source line electrode 165. The first conductivity type and the second conductivity type may be opposite to each other.

The first and second fins 105a and 105b may be used as portions of bit lines and may correspond to the strings S1 and S2 of FIG. 1. One of the common bit line electrodes 160a and 160b may correspond to the common bit line CBL of FIG. 1, and the common source electrode 165 may correspond to the common source line CSL of FIG. 1. The first and second string selection electrodes 155a and 155b may correspond to the first and second string selection lines SSL1 and SSL2 of FIG. 1. The plurality of control gate electrodes 150 may correspond to the plurality of word lines WL of FIG. 1.

The structure of memory transistors including the control gate electrodes 150 will be described with reference to FIGS. 2 and 3. The memory transistors may use the first and second fins 105a and 105b as a channel region (not shown). The semiconductor substrate may further comprise a body 102 connecting the lower ends of the first and second fins 105a and 105b. The semiconductor substrate may be formed by etching a bulk semiconductor wafer. In example embodiments, the first and second fins 105a and 105b may be provided as a semiconductor epilayer.

A buried insulating layer 115 may be filled between the first and second fins 105a and 105b. The first and second fins 105a and 105b, which may be adjacent to the buried insulating layer 115, may be used as the channel region of each memory transistor. An isolation layer 120 may be formed on a body 102, to a desired, or alternatively, a predetermined thickness to cover the lower parts of the first and second fins 105a and 105b. The buried insulating layer 115 may further expand towards the top surface of the first and second fins 105a and 105b.

The control gate electrodes 150 may cover the first and second fins 105a and 105b and expand across the top surface of the first and second fins 105a and 105b and the top surface of the buried insulating layer 115. Charge storage layer 135a may be interposed between the first fin 105a and the control gate electrodes 150, and tunneling insulating layer 130a may be interposed between the charge storage layer 135a and the first fin 105a. Charge storage layer 135b may be interposed between the second fin 105b and the control gate electrodes 150, and tunneling insulating layer 130b may be interposed between the charge storage layer 135b and the second fin 105b. A blocking insulating layer 140 may be interposed between the control gate electrodes 150 and the charge storage layers 135a and 135b.

The charge storage layers 135a and 135b may correspond to the storage node SN of FIG. 1 and may include a polysilicon layer, a nitride layer, a dot, or a nano crystal. The dot or the nano crystal may include particles of metal or polysilicon. The tunneling insulating layers 130a and 130b and the blocking insulating layer 140 may include an oxide layer, a nitride layer, or a high dielectric layer (high-k). The high dielectric layer may have a higher dielectric constant than the oxide layer or the nitride layer.

In example embodiments, the tunneling insulating layers 130a and 130b may expand towards the top of each of the first and second fins 105a and 105b. In addition, the tunneling insulating layers 130a and 130b may be connected to each other across the top of each of the first and second fins 105a and 105b, and the charge storage layers 135a and 135b may be connected to each other across the top of each of the first and second fins 105a and 105b.

The structure of first string selection transistors including the first string selection gate electrode 155a will be described with reference to FIGS. 2 and 4. The first string selection gate electrode 155a may cover the blocking insulating layer 140 and may expand across the top surface of each of the first and second fins 105a and 105b. A portion of the first fin 105a under the first string selection gate electrode 555a may include a first path region 125a doped with impurities of the second conductivity type. The first conductivity type and the second conductivity type may be any one selected from a n-type and a p-type.

The first string selection transistors may have a similar structure to the above-described memory transistors. That is, the tunneling insulating layers 130a and 130b, the charge storage layers 135a and 135b, and the blocking insulating layer 140 may be interposed between portions of the first and second fins 105a and 105b and the first string selection gate electrode 155a. In example embodiments, the tunneling insulating layers 130a and 130b, the charge storage layers 135a and 135b, and the blocking insulating layer 140 may an example of a gate insulating layer, and a single insulating layer may also be used. However, because the structure of the first string selection transistors may be similar to the structure of the memory transistors, the structure of the nonvolatile memory device may be simpler.

The first string selection transistor formed in the first fin 105a may be operated in a depletion mode using the first path region 125a. Accordingly, even though an operation voltage is not applied to the first string selection gate electrode 155a, the first path region 125a may be a conductive path because the first path region 125a is of the second conductivity type similar to the adjacent source or drain region. The first string selection transistor formed in the second fin 105b may also be operated in an enhancement mode.

The structure of second string selection transistors including the second string selection gate electrode 155b will be described with reference to FIGS. 2 and 5. The second string selection gate electrode 155b may cover the blocking insulating layer 140 and may expand across the top surface of each of the first and second fins 105a and 105b. A portion of the second fin 105b under the second string selection gate electrode 155b may include a second path region 125b doped with impurities of the second conductivity type. The above description of the first string selection transistors may be referred to for understanding the structure of the gate insulating layer of the second string selection transistors.

The second string selection transistor formed in the second fin 105b may be operated in a depletion mode using the second path region 125b. Accordingly, even though an operation voltage is not applied to the second string selection gate electrode 155b, the second path region 125b may be a conductive path. The second string selection transistor formed in the first fin 105a may also be operated in an enhancement mode.

In accordance with the above-described structure of the nonvolatile memory device, the selection transistors in the depletion mode may be positioned to realize the circuit of FIG. 1 in a more simple structure.

Figure 6:
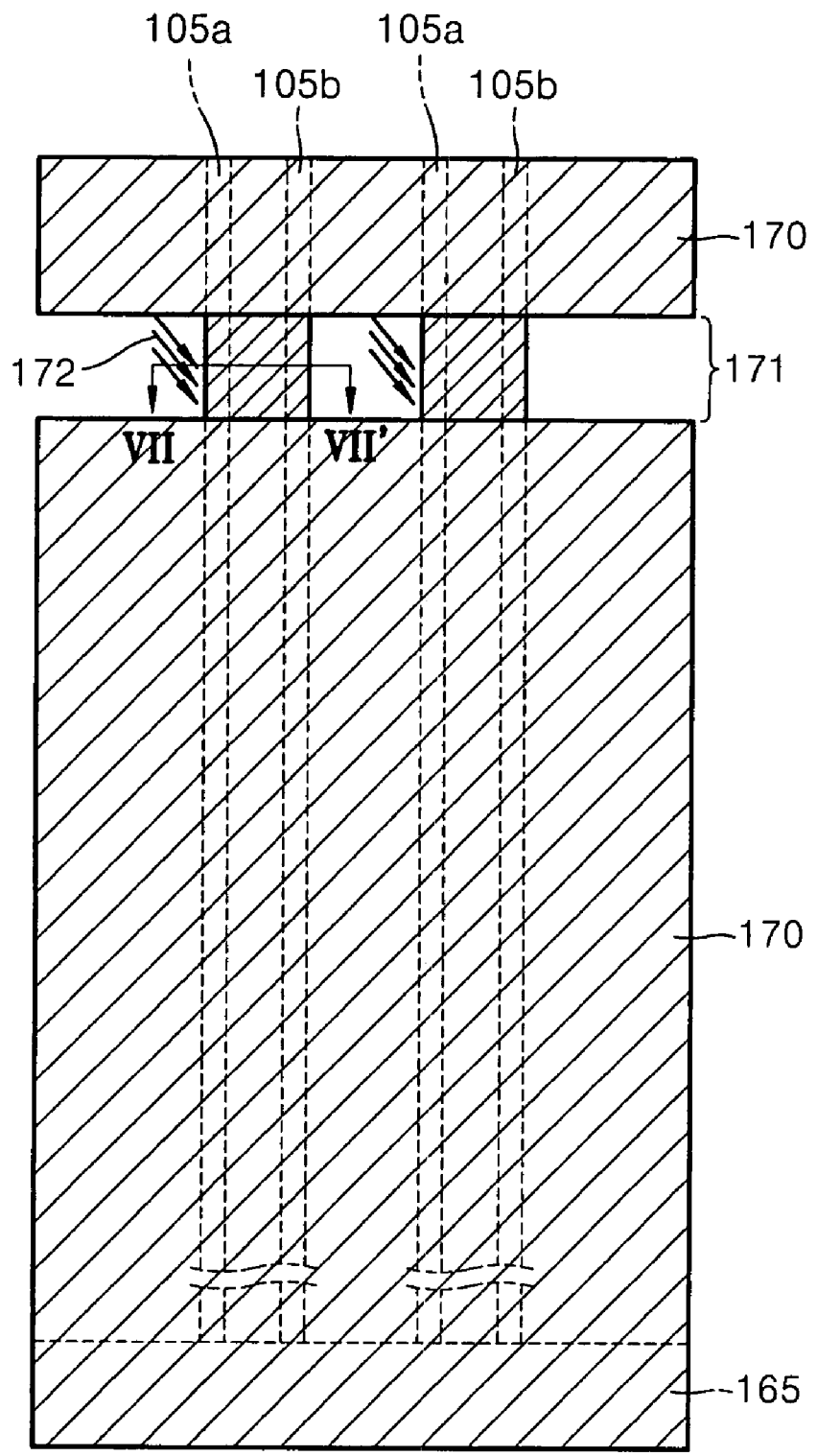
Figure 7:
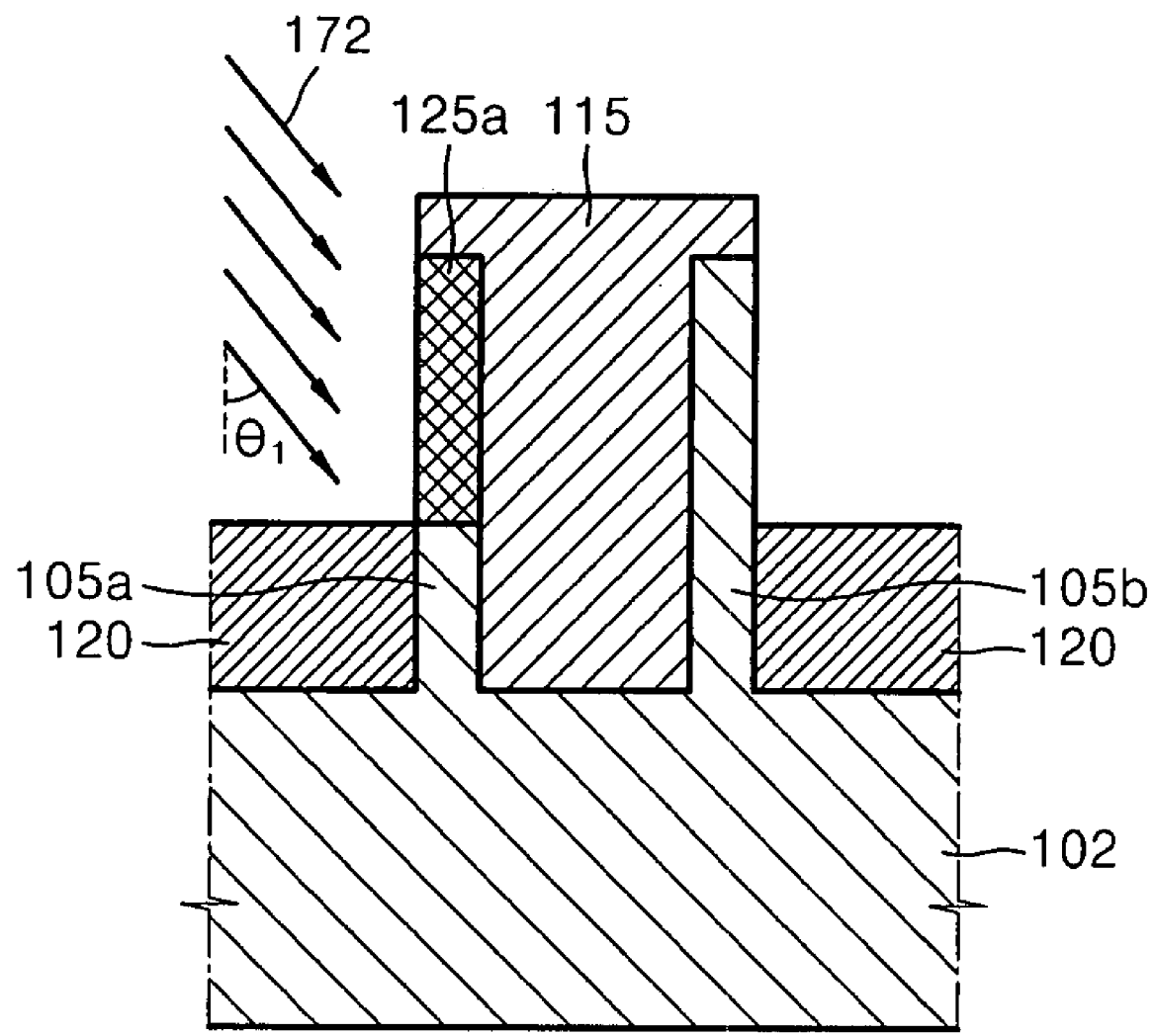
Figure 8:
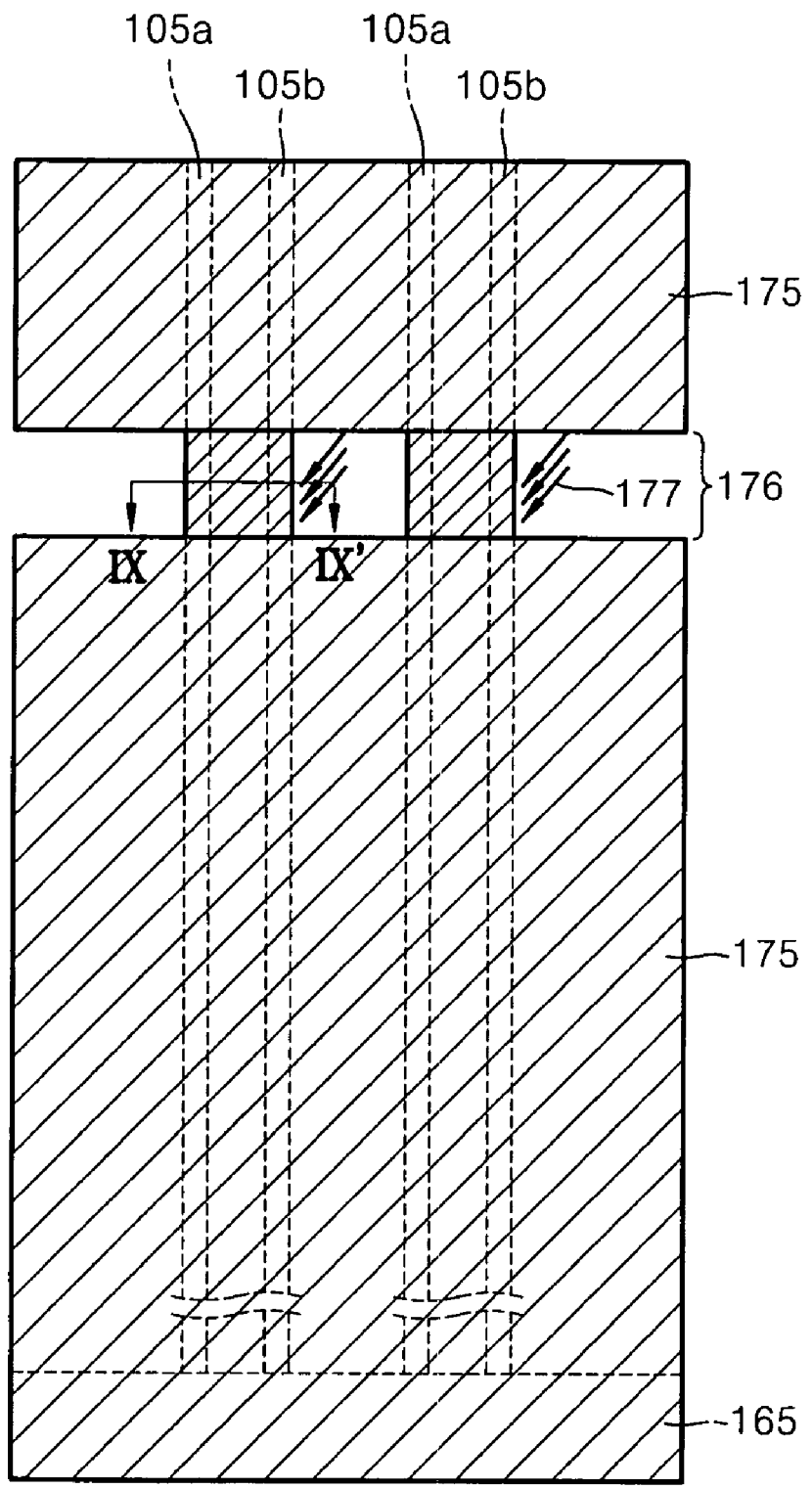
Figure 9:
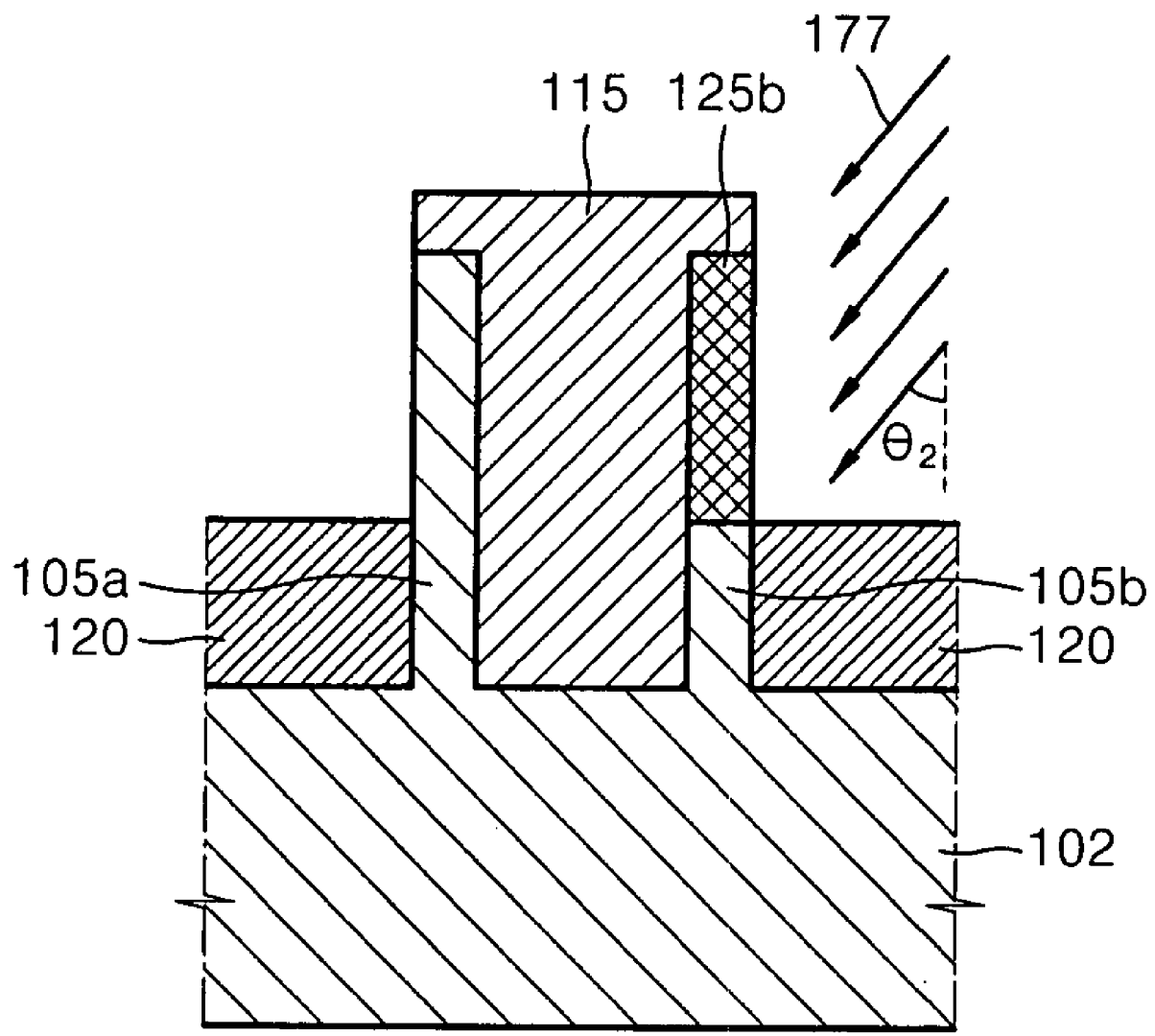
Figure 10:
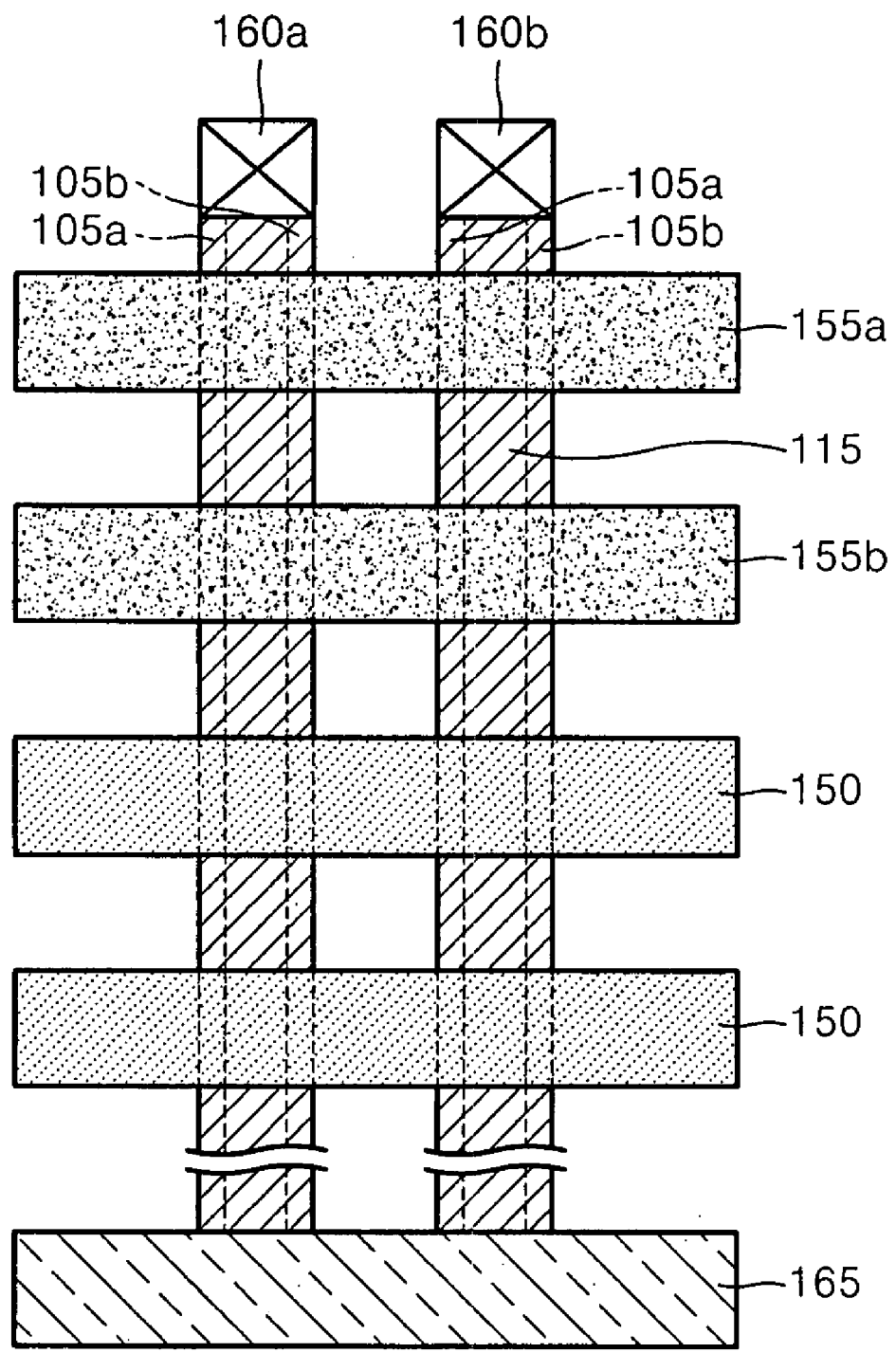

FIGS. 6, 8, and 10 are plan views for describing a method of fabricating a nonvolatile memory device according to example embodiments. FIGS. 7 and 9 are cross-sectional views taken along Line VII-VII' and Line IX-IX' of the nonvolatile memory device of FIGS. 6 and 8, respectively.

In FIGS. 6 and 7, a semiconductor substrate including first and second fins 105a and 105b may be provided. The first and second fins 105a and 105b may be formed to protrude from a body 102 by etching a bulk semiconductor wafer. Subsequently, a buried insulating layer 115 may be filled between the first and second fins 105a and 105b. Accordingly, the first and second fins 105a and 105b, which may be positioned adjacent to the buried insulating layer 115, may be used as a channel region.

A first mask layer 170 may be formed on the semiconductor substrate to expose a first region 171 of the first and second fins 105a and 105b. The first mask layer 170 may include a photoresist layer.

A first path region 125a may then be formed by selectively implanting impurities 172 of a second conductivity type in the first fin 105a within the first region 171. The first path region 125a may be formed by using a tilt ion implantation method. More specifically, the impurities 172 of the second conductivity type may be implanted in the first fin 105a at a tilt angle, for example, at a first angle $\theta_1$ by using the first mask layer 170 as an ion implantation protection layer. Accordingly, the impurities 172 of the second conductivity type may be implanted in the first fin 105a at the tilt angle but may not be implanted in the second fin 105b. The first angle $\theta_1$ may be greater than 0° and less than 90°, and may be within the range of about 5° to about 45°.

In FIGS. 8 and 9, a second mask layer 175 may be formed on the semiconductor substrate to expose a second region 176 of the first and second fins 105a and 105b. The second mask layer 175 may include a photoresist layer.

A second path region 125b may be formed by selectively implanting impurities 177 of the second conductivity type in the second fin 105b within the second region 176. The second path region 125b may be formed by using the tilt ion implantation method. More specifically, the impurities 177 of the second conductivity type may be implanted in the second fin 105b at a tilt angle, for example, at a second angle $\theta_2$ by using the second mask layer 175 as an ion implantation protecting layer. Accordingly, the impurities 177 of the second conductivity type may be implanted in the second fin 105b at the tilt angle but may not be implanted in the first fin 105a. The second angle $\theta_2$ may be greater than 0° and less than 90°, and may be within the range of about 5° to about 45°.

In FIG. 10, first and second string selection gate electrodes 155a and 155b may be formed to cover the first and second fins 105a and 105b, respectively, inside the first and second regions 171 and 176 and to expand across the top surface of each of the first and second fins 105a and 105b. Further, control gate electrodes 150 may be formed to cover the first and second fins 105a and 105b, respectively, outside the first and second regions 171 and 176 and to expand across the top surface of each of the first and second fins 105a and 105b. The first and second string selection gate electrodes 155a and 155b and the control gate electrodes 150 may be formed simultaneously or in any arbitrary order.

Common bit line electrodes 160a and 160b may then be formed to connect one end of the first fin 105a and one end of the second fin 105b, and a common source line electrode 165 may be formed to connect the other end of the first fin 105a and the other end of the second fin 105b. A source or drain region having the second conductivity type may be formed in the first and second fins 105a and 105b between the common bit line electrodes 160a and 160b, the first and second string selection gate electrodes 155a and 155b, the control gate electrodes 150, and the common source line electrode 165. A portion of the source or drain region may be formed simultaneously with the forming of the first and/or second path regions 125a and/or 125b. Subsequently, the forming of the nonvolatile memory device may be completed.

In accordance with example embodiments, the first or second path region 125a or 125b may be selectively formed in the first and second fins 105a and 105b by using the tilt ion implantation method. Therefore, the method of fabricating the nonvolatile memory device according to example embodiments may be more cost-effective because the patterning step to select the first and second fins 105a and 105b may be skipped.

Figure 11:
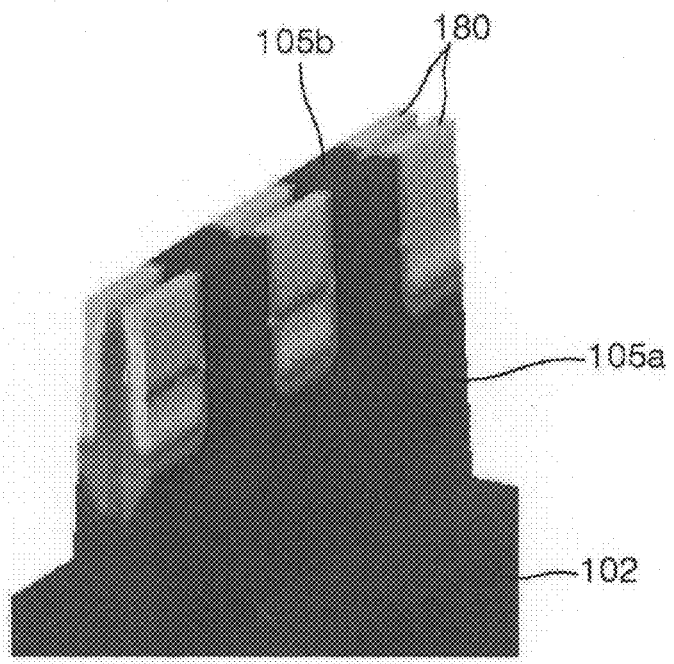
Figure 12:
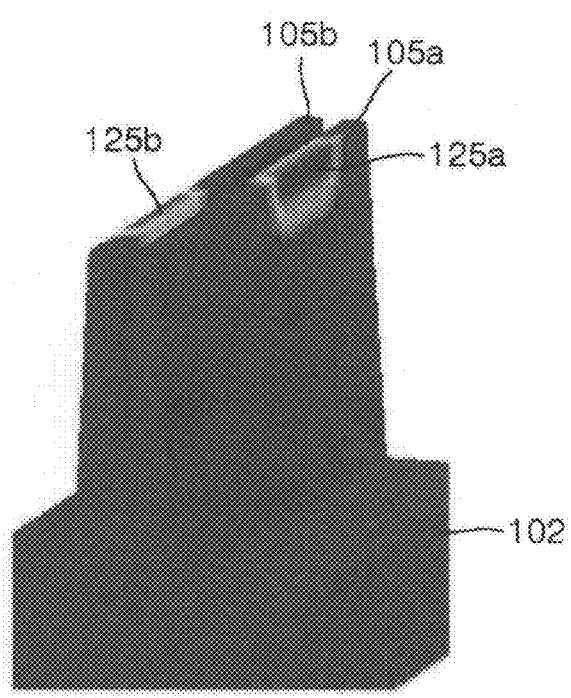
Figure 13:
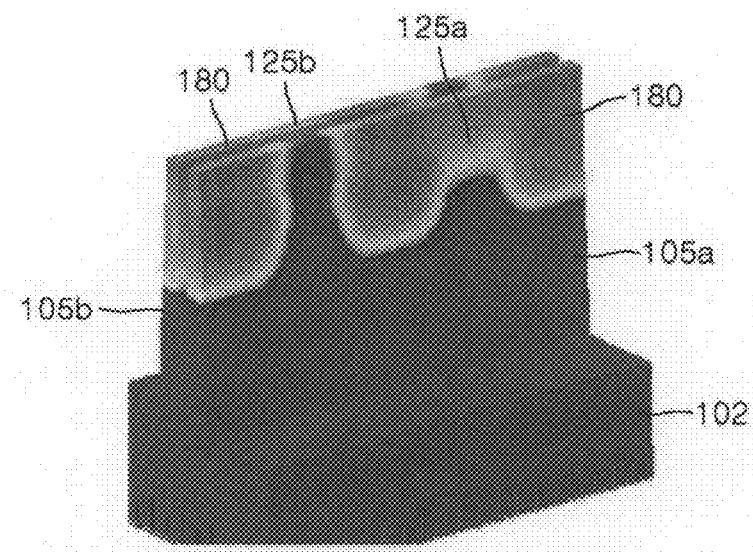

FIGS. 11 through 13 are simulation perspective views of doping profiles of a nonvolatile memory device according to example embodiments. FIGS. 11 through 13 illustrate the first and second string selection transistors of FIG. 10.

In FIG. 11, a source or drain region 180 may be limited to desired, or alternatively, predetermined portions of the first and second fins 105a and 105b. The source or drain region 180 may be limited to the portions of the first and second fins 105a and 105b at both sides of the first and second string selection gate electrodes 155a and 155b of FIG. 10.

In FIG. 12, the first and second path regions 125a and 125b may be selectively limited to the first and second fins 105a and 105b by using the tilt ion implantation method.

In FIG. 13, the first and second path regions 125a and 125b may be positioned between the source or drain region 180 by performing the processes of FIGS. 11 and 12 in any arbitrary order. The first path region 125a in the first fin 105a may correspond to the first region 171 of FIG. 6 and may be connected to the adjacent source or drain region 180 by using the impurities of the second conductivity type. Likewise, the second path region 125b in the second fin 105b may correspond to the second region 176 of FIG. 8 and may be connected to the adjacent source or drain region 180 by using the impurities of the second conductivity type.

Figure 14:
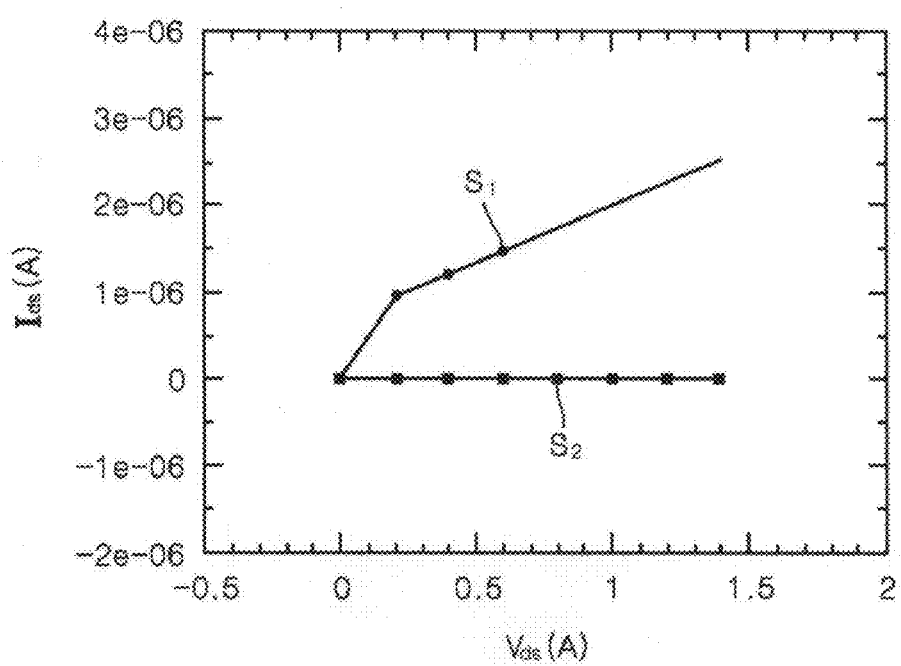

FIG. 14 is a simulation graph of the voltage-current characteristics of a nonvolatile memory device according to example embodiments. In the simulation, a turn-off voltage (e.g., about 0V) may be applied to the first string selection line SSL1 and a turn-on voltage (e.g., about 2V) may be applied to the second string selection line SSL2.

In FIG. 14, a current may not flow in the second string S2 and may flow in the first string S1 only. Accordingly, the operations of the first and second strings S1 and S2 may be distinguished from each other. Because the first selection transistor is off, no current may flow in the second string S2. However, the current may flow in the first string S1 through the first path region (first path region 125a of FIG. 7).

Figure 15:
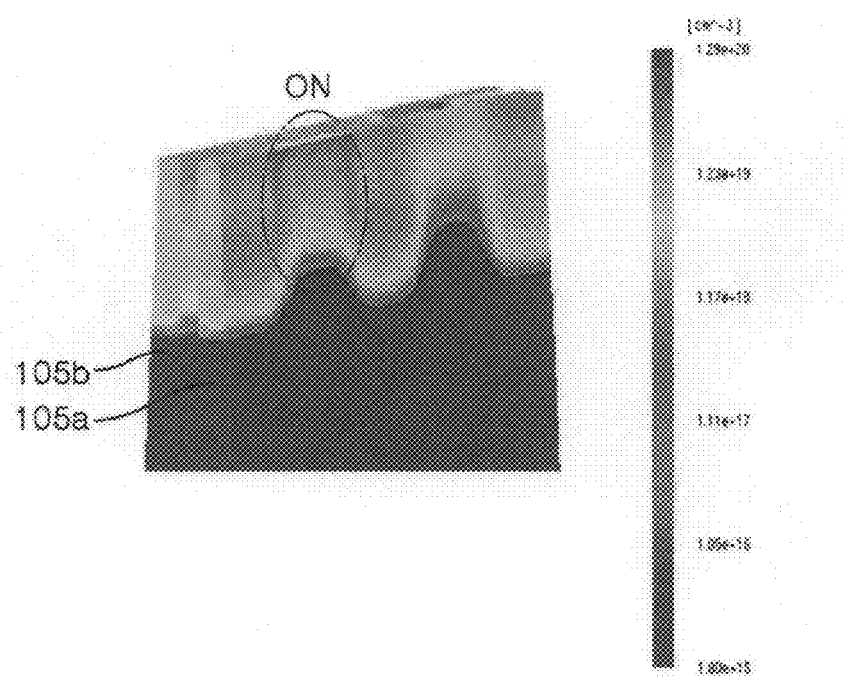
Figure 16:
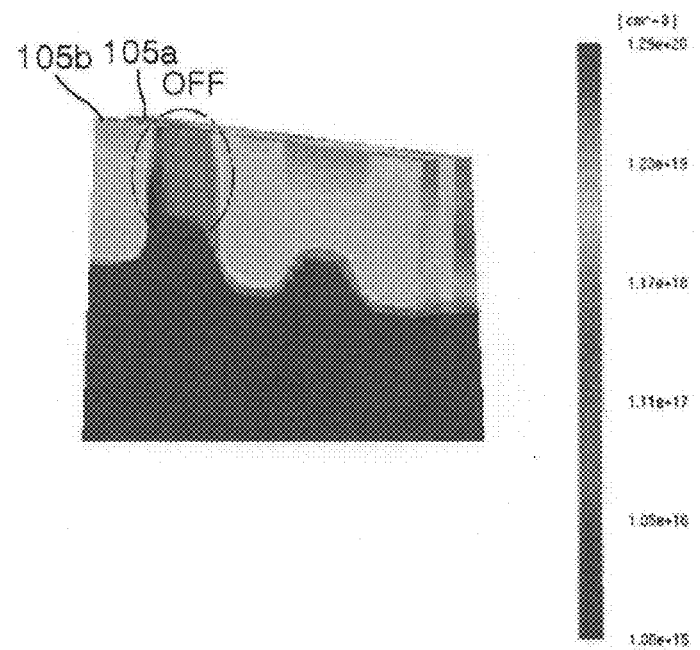

FIGS. 15 and 16 are simulation perspective views of electron concentration profiles of a nonvolatile memory device according to an experimental example. FIGS. 15 and 16 illustrate the results of the measurements according to FIG. 14.

In FIGS. 15 and 16, the channel may be on in the first fin 105a (in which the channel is indicated as "ON") but may be off in the second fin 105b (in which the channel is indicated as "OFF"). Therefore, the current may flow in the first string S1 and not flow in the second string S2. These simulation results indicate that the first and second fins 105a and 105b may selectively operate.

The nonvolatile memory device according to example embodiments may include the above described common bit line structure to reduce the space between the strings, thereby having higher integration density. Furthermore, because the string selection lines may be separated, the strings may be individually operated.

The common bit line electrode according to example embodiments may have a broader contact area with the fins in comparison to a conventional individual bit line electrode. Therefore, the contact resistance between the fins and the common bit line electrode may be reduced in comparison to the conventional art.

In the method of fabricating the nonvolatile memory device according to example embodiments, the first or second path region may be selectively formed in the first and second fins by using the tilt ion implantation method. Therefore, the method may be more cost-effective because the patterning step of the first and second fins may be omitted.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A nonvolatile memory device comprising:
   a semiconductor substrate of a first conductivity type including first and second fins;
   a buried insulating layer filled between the first and second fins;
   a common bit line electrode connecting one end of the first fin to one end of the second fin;
   a plurality of control gate electrodes covering the first and second fins and expanding across a top surface of each of the first and second fins;
   a first string selection gate electrode, between the common bit line electrode and the plurality of control gate electrodes, covering the first and second fins and expanding across the top surface of each of the first and second fins; and
   a second string selection gate electrode, between the first string selection gate electrode and the plurality of control gate electrodes, covering the first and second fins and expanding across the top surface of each of the first and second fins,
   wherein a portion of the first fin under the first string selection gate electrode and a portion of the second fin under the second string selection gate electrode have a second conductivity type opposite to the first conductivity type.

2. The nonvolatile memory device of claim 1, wherein the semiconductor substrate further comprises a body connecting a lower end of the first fin to a lower end of the second fin.

3. The nonvolatile memory device of claim 1, wherein the first and second fins are adjacent to the buried insulating layer.

4. The nonvolatile memory device of claim 1, further comprising:
a source or a drain region defined by the first and second fin portions between the common bit line electrode, the first string selection gate electrode, the second string selection gate electrode, and the plurality of control gate electrodes, the source or drain region having the second conductivity type.

5. The nonvolatile memory device of claim 1, further comprising:
a plurality of charge storage layers respectively interposed between the plurality of control gate electrodes and the first and second fins.

6. The nonvolatile memory device of claim 5, further comprising:
a plurality of tunneling insulating layers respectively interposed between the first and second fins and the plurality of charge storage layers.

7. The nonvolatile memory device of claim 5, further comprising:
a plurality of blocking insulating layers respectively interposed between the plurality of charge storage layers and the plurality of control gate electrodes.

8. The nonvolatile memory device of claim 1, further comprising:
a common source line electrode connected to the other end of each of the first and second fins.

9. The nonvolatile memory device of claim 1, wherein the semiconductor substrate is formed by etching a bulk semiconductor wafer.

10. A method of fabricating a nonvolatile memory device, comprising:
providing a semiconductor substrate of a first conductivity type, the semiconductor substrate including first and second fins, the first and second fins respectively defining first and second regions in different rows from each other, wherein a buried insulating layer is filled between the first and second fins; forming a common bit line electrode connecting one end of the first fin to one end of the second fin; forming a plurality of control gate electrodes covering the first and second fins and expanding across a top surface of each of the first and second fins;
forming a first path region of a second conductivity type opposite to the first conductivity type in the first region of the first fin;
forming a second path region of the second conductivity type in the second region of the second fin;
forming a first string selection gate electrode between the common bit line electrode and the plurality of control gate electrodes, covering the first and second fins in the first region and expanding across the top surface of each of the first and second fins; and
forming a second string selection gate electrode between the first string selection gate electrode and the plurality of control gate electrodes, covering the first and second fins in the second region and expanding across the top surface of each of the first and second fins.

11. The method of claim 10, further comprising:
wherein the buried insulating layer if filled between the first and second fins before forming the first path region.

12. The method of claim 11, wherein the first and second fins are adjacent to the buried insulating layer.

13. The method of claim 12, wherein the forming of the first path region is performed by using tilt ion implantation.

14. The method of claim 13, wherein the forming of the first path region comprises:
forming a first mask layer to expose the first region of the first and second fins; and
implanting impurities of the second conductivity type at a first angle which is greater than 0° and less than 90° into the first fin so as to be selectively incident on one side of the first fin by using the first mask layer as an ion implantation protecting layer.

15. The method of claim 12, wherein the forming of the second path region is performed by using tilt ion implantation.

16. The method of claim 15, wherein the forming of the second path region comprises:
forming a second mask layer to expose the second region of the first and second fins; and
implanting impurities of the second conductivity type at a second angle which is greater than 0° and less than 90° into the second fin so as to be selectively incident on one side of the second fin by using the second mask layer as an ion implantation protecting layer.

17. The method of claim 10, wherein the
forming a plurality of control gate electrodes forms the plurality of control gate electrodes covering the first and second fins outside the first and second regions.

18. The method of claim 17, further comprising:
forming a source or drain region by implanting impurities of the second conductivity type into portions of the first and second fins between the first string selection gate electrode, the second string selection gate electrode, and the plurality of control gate electrodes.

19. The method of claim 10, wherein the providing of the semiconductor substrate comprises forming the first and second fins protruding from a body by etching a bulk semiconductor wafer.

20. A nonvolatile memory device comprising:
a semiconductor substrate of a first conductivity type including first and second fins;
a buried insulating layer filled between the first and second fins;
a common bit line electrode connecting one end of the first fin to one end of the second fin;
a plurality of control gate electrodes covering the first and second fins and expanding across a top surface of each of the first and second fins;
a first string selection gate electrode, between the common bit line electrode and the plurality of control gate electrodes, covering the first and second fins and expanding across the top surface of each of the first and second fins; and
a second string selection gate electrode, between the first string selection gate electrode and the plurality of control gate electrodes, covering the first and second fins and expanding across the top surface of each of the first and second fins,
wherein a portion of the first fin under the first string selection gate electrode and a portion of the second fin under the second string selection gate electrode have a second conductivity type opposite to the first conductivity type, and
at least a portion of at least one of the first and second fins includes a path region for depletion mode operation.

* * * * *